United States Patent
Kobayashi

[11] Patent Number: 6,130,567
[45] Date of Patent: Oct. 10, 2000

[54] SEMICONDUCTOR DELAY CIRCUIT HAVING INVERTER CIRCUITS AND TRANSFER GATES

[75] Inventor: Yasuo Kobayashi, Tokyo, Japan

[73] Assignee: NEC Corporation, Tokyo, Japan

[21] Appl. No.: 09/056,643

[22] Filed: Apr. 8, 1998

[30] Foreign Application Priority Data

Apr. 18, 1997 [JP] Japan .................................. 9-116415

[51] Int. Cl.[7] .................................................. H03H 11/26
[52] U.S. Cl. .............................................. 327/278; 277/288
[58] Field of Search ................................... 327/276–278, 327/261, 281, 288, 407, 408

[56] References Cited

U.S. PATENT DOCUMENTS

| | | | |
|---|---|---|---|
| 4,737,670 | 4/1988 | Chan | 327/278 |
| 5,111,085 | 5/1992 | Stewart | 327/278 |
| 5,185,540 | 2/1993 | Boudry | 327/276 |
| 5,204,564 | 4/1993 | Ochiai | 327/278 |
| 5,389,843 | 2/1995 | McKinney | 327/276 |
| 5,949,268 | 9/1999 | Miura et al. | 327/288 |

FOREIGN PATENT DOCUMENTS

| | | |
|---|---|---|
| 2-139957 | 5/1990 | Japan . |
| 4-299611 | 10/1992 | Japan .................................. 327/278 |
| 8-274601 | 10/1996 | Japan . |

Primary Examiner—Kenneth B. Wells
Attorney, Agent, or Firm—Foley & Lardner

[57] ABSTRACT

A semiconductor delay circuit which can realize a fine delay time regulation pitch and can set a number of regulation steps is provided. A plurality of inverter tree circuit each having a plurality of propagation paths having delay times different with an equal pitch are connected in series and outputs of the propagation paths are selectively transmitted externally by a switch circuit.

5 Claims, 12 Drawing Sheets

| C1 | C2 | S1 | S2 | S3 | S4 |
|---|---|---|---|---|---|
| L | L | H | L | L | L |
| H | L | L | H | L | L |
| L | H | L | L | H | L |
| H | H | L | L | L | H |

Fig.12

| C1 | C2 | C3 | S1 | S2 | S3 | S4 | S5 | S6 | S7 | S8 |
|---|---|---|---|---|---|---|---|---|---|---|
| L | L | L | H | L | L | L | L | L | L | L |
| H | L | L | L | H | L | L | L | L | L | L |
| L | H | L | L | L | H | L | L | L | L | L |
| H | H | L | L | L | L | H | L | L | L | L |
| L | L | H | L | L | L | L | H | L | L | L |
| H | L | H | L | L | L | L | L | H | L | L |
| L | H | H | L | L | L | L | L | L | H | L |
| H | H | H | L | L | L | L | L | L | L | H |

Fig.13

|     | (psec)   |
| --- | -------- |
| S1  | 480 + B  |
| S2  | 600 + B  |
| S3  | 720 + B  |
| S4  | 840 + B  |
| S5  | 960 + B  |
| S6  | 1080 + B |
| S7  | 1200 + B |
| S8  | 1320 + B |

Fig.14

| (Si) | (Si') | (psec) |
|---|---|---|
| S1 | S1 | 480 + C |
| S2 | S1 | 600 + C |
| S3 | S1 | 720 + C |
| S4 | S1 | 840 + C |
| S1 | S2 | 960 + C |
| S2 | S2 | 1080 + C |
| S3 | S2 | 1200 + C |
| S4 | S2 | 1320 + C |
| S1 | S3 | 1440 + C |
| S2 | S3 | 1560 + C |
| S3 | S3 | 1680 + C |
| S4 | S3 | 1800 + C |
| S1 | S4 | 1920 + C |
| S2 | S4 | 2040 + C |
| S3 | S4 | 2160 + C |
| S4 | S4 | 2280 + C |

# SEMICONDUCTOR DELAY CIRCUIT HAVING INVERTER CIRCUITS AND TRANSFER GATES

BACKGROUND OF THE INVENTION

1. Field of the Invention

The present invention relates to a semiconductor delay circuit and, particularly, to a semiconductor delay circuit having a function of regulating a delay time of an output signal to a desired value.

2. Description of Related Art

With the progression of the semiconductor technology, an operating speed of a semiconductor integrated circuit (LSI) is being increased. For example, a dynamic random access memory (DRAM) having an operation clock frequency of 200 MHz or more has been developed and it is expected that a DRAM having operation clock frequency of 400 MHz or more will be realized in the near future.

With increase of the operating speed of the semiconductor integrated circuit, a propagation delay of a signal on a printed circuit board becomes more and more important. For example, considering a system in which a logic LSI including such as a CPU and a plurality of DRAM's are mounted on a printed circuit board, distances between the logic LSI and the individual DRAMs are generally different. Therefore, the propagation delay times from the respective DRAM's to the logic LSI are different mutually. Therefore, there is a problem that the higher the operating speed of the DRAM makes the smaller the margin of an output timing due to the difference in propagation delay time. For example, there is a possibility of occurrence of an erroneous operation in a certain DRAM (for example, a DRAM which is farthest from a logic LSI) due to deviation of signal timing.

As one of solutions to this problem, it is considered to regulate delay times in a semiconductor integrated circuit. In the case mentioned above, for example, the deviation of timing may be corrected by regulating the delay times of the DRAMs to desired values, respectively.

A variety of techniques for regulating delay time have been proposed. For example, a semiconductor integrated circuit has been proposed in Japanese Patent Application Laid-open No. H2-139957, in which series-connected n delay circuits are connected to an input terminal and outputs derived from the respective delay circuits or outputs each derived for every plurality of delay circuits are supplied to a selector, and one of the outputs is selected thereby according to a control signal supplied from a control terminal to regulate the delay time which is output to an internal circuit.

An another example, in, for example, Japanese Patent Application Laid-open No. H8-274601 which discloses a circuit for regulating a delay time by supplying outputs of a plurality of series connected delay circuits to a selector and selecting one of them, a signal input to a delay regulation terminal is input to a flip-flop and synchronized with one of the outputs of the delay circuits whose delay time is the longest as a selection signal of the selector.

These prior art techniques have the following problems. That is, a first problem is that it is difficult to finely regulate the delay time. This is because it is impossible to make a difference between delay outputs smaller than a delay time corresponding to series-connected two inverters which constitute a delay circuit since a plurality of such delay circuits are connected in series.

A second problem is that it is impossible to sufficiently increase the number of regulating steps. The reason for this is that, since it is impossible to finely regulate the delay time in relation to the first problem, the longest delay time becomes too large when the number of regulating steps is increased.

SUMMARY OF THE INVENTION

Therefore, an object of the present invention is to provide a semiconductor delay circuit which can finely regulate the delay time.

Another object of the present invention is to provide a semiconductor delay circuit which can make the number of regulating steps desirable without increasing the longest delay time.

A semiconductor delay circuit according to the present invention includes a first inverter circuit having an input node coupled to an input terminal and an output node. The circuit also includes a second inverter circuit having an input node coupled to the output node of the first inverter and an output node coupled to an output terminal via a first transfer gate. The second inverter circuit has a first current drive ability. A third inverter circuit has an input node coupled to the output node of the first inverter and an output node coupled to the output terminal via a second transfer gate. The second inverter circuit has a second current drive ability different from the first current drive ability.

BRIEF DESCRIPTION OF THE DRAWINGS

The above and other objects, features and advantages of the present invention will become more apparent by reference to the following detailed description of the present invention taken in conjunction with the accompanying drawings, in which.

DETAILED DESCRIPTION OF THE PREFERRED EMBODIMENTS

Before describing the semiconductor delay circuit according to the present invention, an example of the conventional semiconductor delay circuit will be described. It will become apparent that the semiconductor delay circuit according to the present invention is superior by comparing it with the example.

Figure 7:
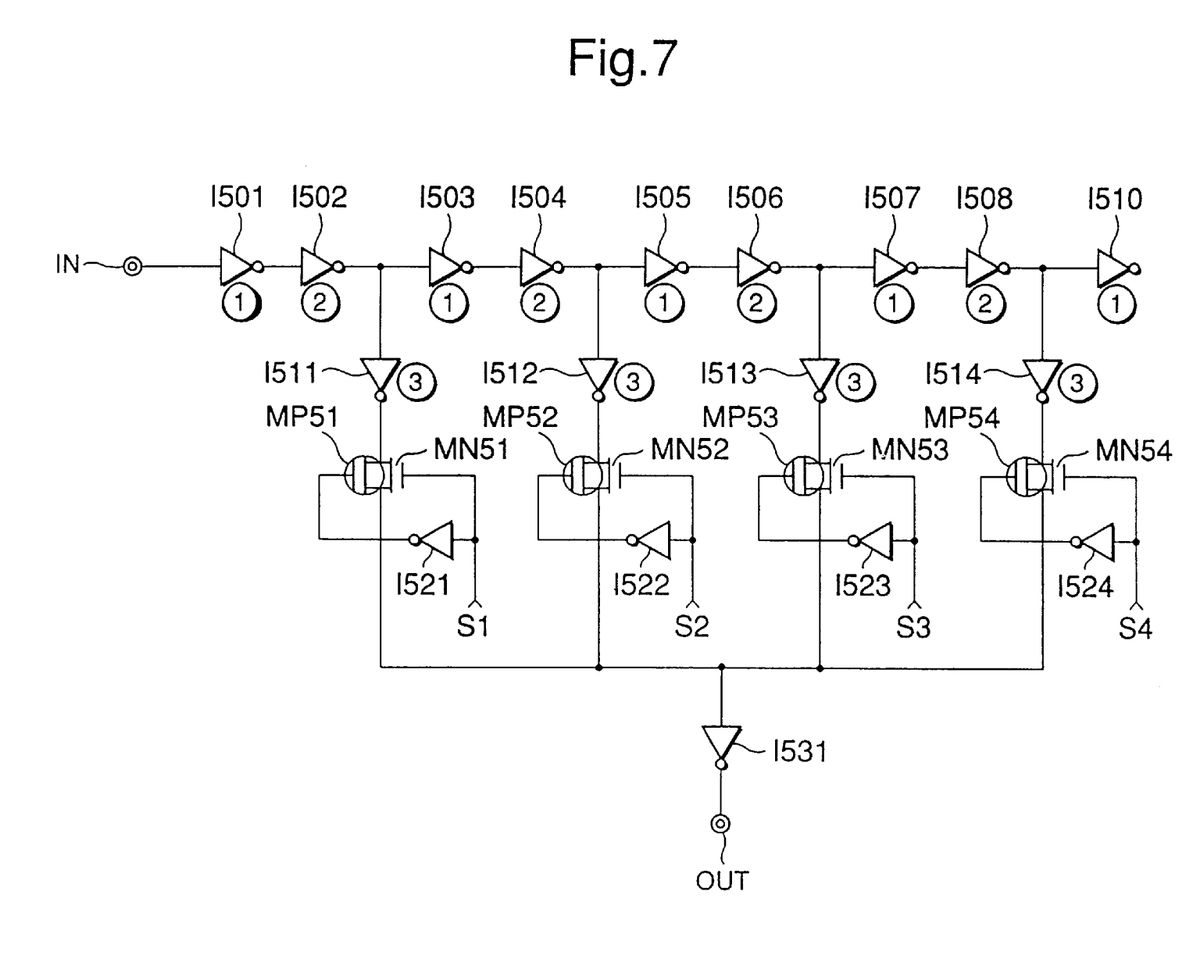
FIG. 7 is a circuit diagram of a prior art semiconductor delay circuit.

FIG. 7 shows a circuit construction of a semiconductor delay circuit according to the example. In this semiconductor delay circuit, the number of the inverters depends upon a selection signal S1, S2, S3 or S4 which is selected, that is, "H" level, and, therefore, a propagation delay time from an input signal to an output signal depends upon the selection signal selected.

In FIG. 7, encircled numerals 1, 2 and 3 are attached to the inverters I501 to I508 and I510 to I514. For example, an encircled numeral 1 is attached to the inverter I501, an encircled numeral 2 is attached to the inverter I502 and an encircled numeral 3 is attached to the inverter I511. Each encircled numeral defines a relative gate width of a transistor constituting a corresponding inverter for convenience.

Figure 8:
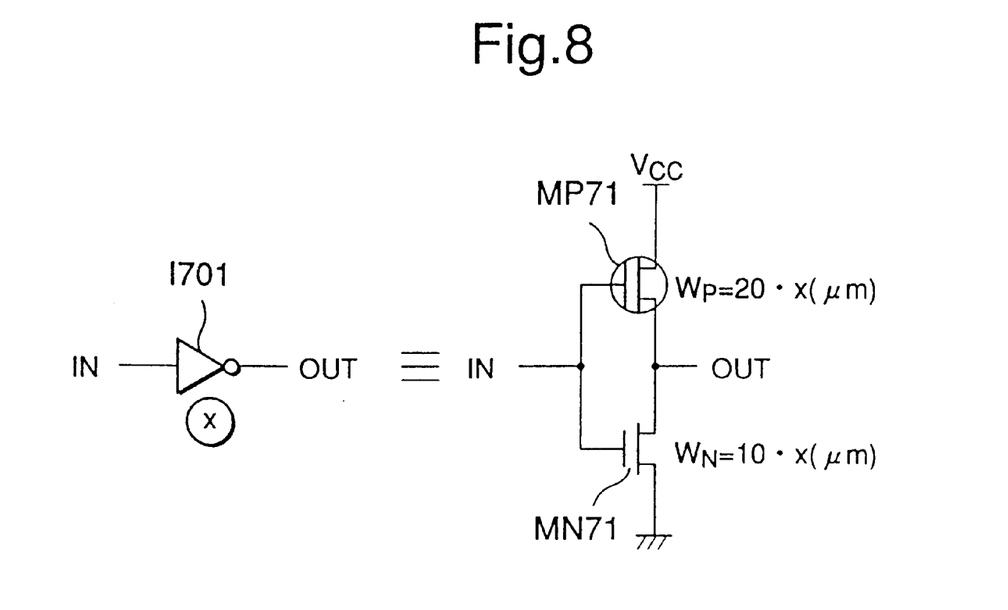
FIG. 8 is a circuit diagram showing a definition of a relative size of inverter.

Referring to FIG. 8, a CMOS inverter composed of a P channel transistor MP71 having a gate width of 20 m and an N channel transistor MN71 having a gate width of 10 m has a unit inverter size and a size "x" of another inverter is determined by comparing it with the unit size. The "x" will be referred to as "relative size". For example, an inverter having a relative size x=1.5 includes a P channel transistor having a gate width of 30 m and an N channel transistor having a gate width of 15 m.

Incidentally, in the inverter shown in FIG. 8, a ratio of the current drive ability of the P channel transistor to that of the N channel transistor is 1:2. That is, in order to make the propagation delay time in a case where an output of the inverter rises equal to that in a case where it falls, the ratio of the gate width Wp of the P channel transistor to the gate width Wn of the N channel transistor is selected as 2:1. It is general, in order to make the current drive ability of a P channel transistor to that of an N channel transistor 1:r, that the gate width ratio of the P channel transistor to that of the N channel transistor is made r:1.

Figure 9:
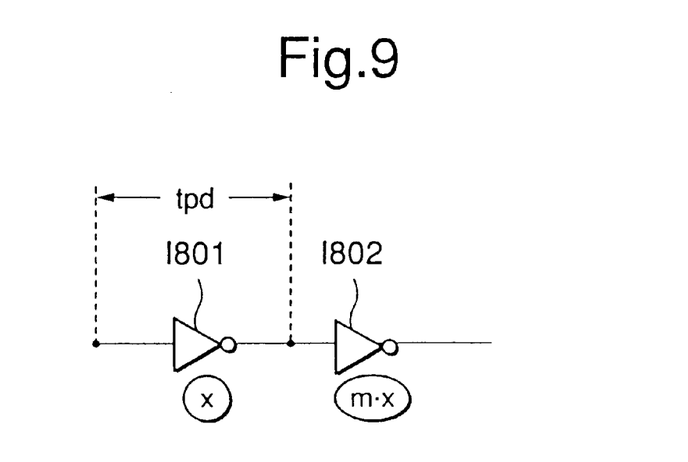
FIG. 9 is a circuit showing definitions of m and tpd of an inverter.

FIG. 9 shows a circuit including an inverter I801 having a relative size x and an inverter I802 connected in series with the inverter I801 and having a relative size m x. In FIG. 9, the propagation delay time of the inverter I801 is depicted by tpd.

Figure 10:
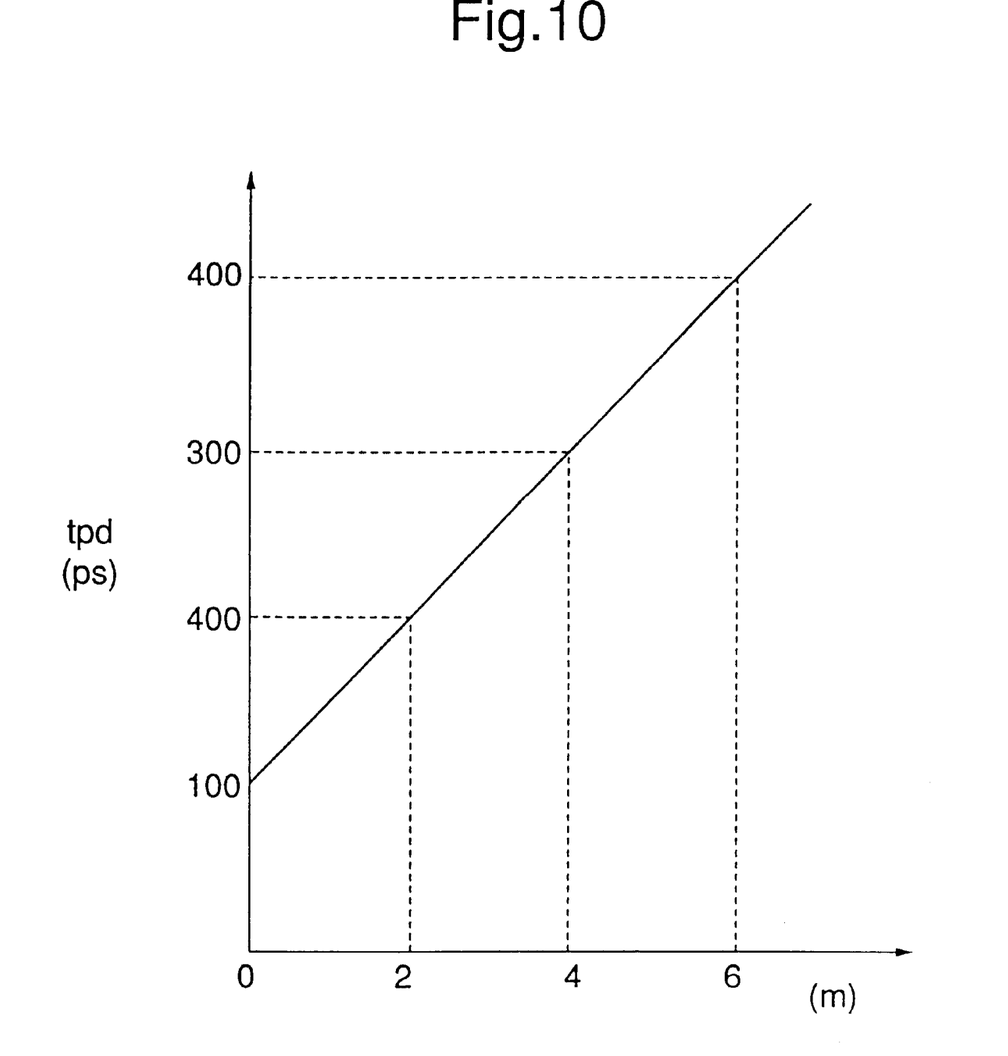
FIG. 10 is a graph showing a relation between m and tpd of an inverter.

Further, FIG. 10 shows a relation between m and tpd defined in FIG. 9. As well known, it is general that the larger the ratio m to the size of the succeeding stage provides the longer the charging (discharging) time of a capacitive load, that is, the longer the delay time tpd and an approximated linear relation between m and tpd such as shown in FIG. 10 is obtained. The relation between m and tpd depends generally upon the performance of the MOS transistor and FIG. 10 shows an example thereof. For example, when the gate length (channel length) of a transistor is reduced, the performance of the transistor is improved and, for the same m, the tpd becomes smaller.

Referring again to FIG. 7, since the relative size of the inverter I501 is 1 and the relative size of the inverter I502 is 2, the ratio of the relative size of the inverter I501 to that of the inverter I502 is 1:2. Therefore, tpd for m=2, that is, 200 psec, in FIG. 10 is the propagation delay time of the inverter I501. Further, since the load of the inverter I502 is inverters I503 and I511 and a sum of the relative sizes of the inverter I503 (m=3) and the inverter I511 (m=1) is 1+3 =4, the ratio of the relative size of the inverter I502 to that of the inverters I503 and I511 becomes 2:4=1:2.

Therefore, the delay time of the inverter I502 is the same as that of the inverter I501, that is, 200 psec. Similarly, the delay times of the inverters I503 to I508 are 200 psec, respectively. Incidentally, the inverter I510 is provided for load regulation in order to regulate tpd of the inverter I508 equal to those of the others.

A switch circuit controlled by the selection signals S1 to S4 will be described. In FIG. 7, it is assumed that transistors MP51, MP52, MP53 and MP54 have the same size. Further, it is also assumed that transistors MN51, MN52, MN53 and MN54 have the same size. In addition, it is assumed that inverters I521, I522, I523 and I524 have the same size. With such construction, propagation delay times of a path from the inverter I511 to the inverter I531, a path from the inverter I513 to the inverter I531 and a path from the inverter I514 to the inverter I541 become the same. This propagation delay time will be referred to as A(psec) for convenience.

Since, when the selection signal S1 is selected, a total propagation delay time from the input terminal IN to the output terminal OUT is a sum of the delay times of the inverters I501, I502, I511 to I531, it becomes as follow.

$$200+200+A=400+A(\text{psec})$$

When the selection signal S2 is selected, the total propagation delay time from the input terminal IN to the output terminal OUT is a sum of the delay times of the inverters I501, I502, I503, I504 and I512 to I531 and it becomes as follow.

$$200+200+200+200+A=800+A(\text{psec})$$

Similarly, when the selection signal S3 is selected, the total propagation delay time becomes 1200+A (psec) and, when the selection signal S4 is selected, the total propagation delay time becomes 1600+A (psec).

Therefore, by switching the selection signal from S1 through S2 and S3 to S4, the delay time increased stepwise with a pitch of 400 psec. That is, it is possible to set the delay time with the pitch of 400 psec which corresponds to two inverters.

The semiconductor delay circuit according to preferred embodiments of the present invention will be described in detail with reference to the drawings.

Figure 1:
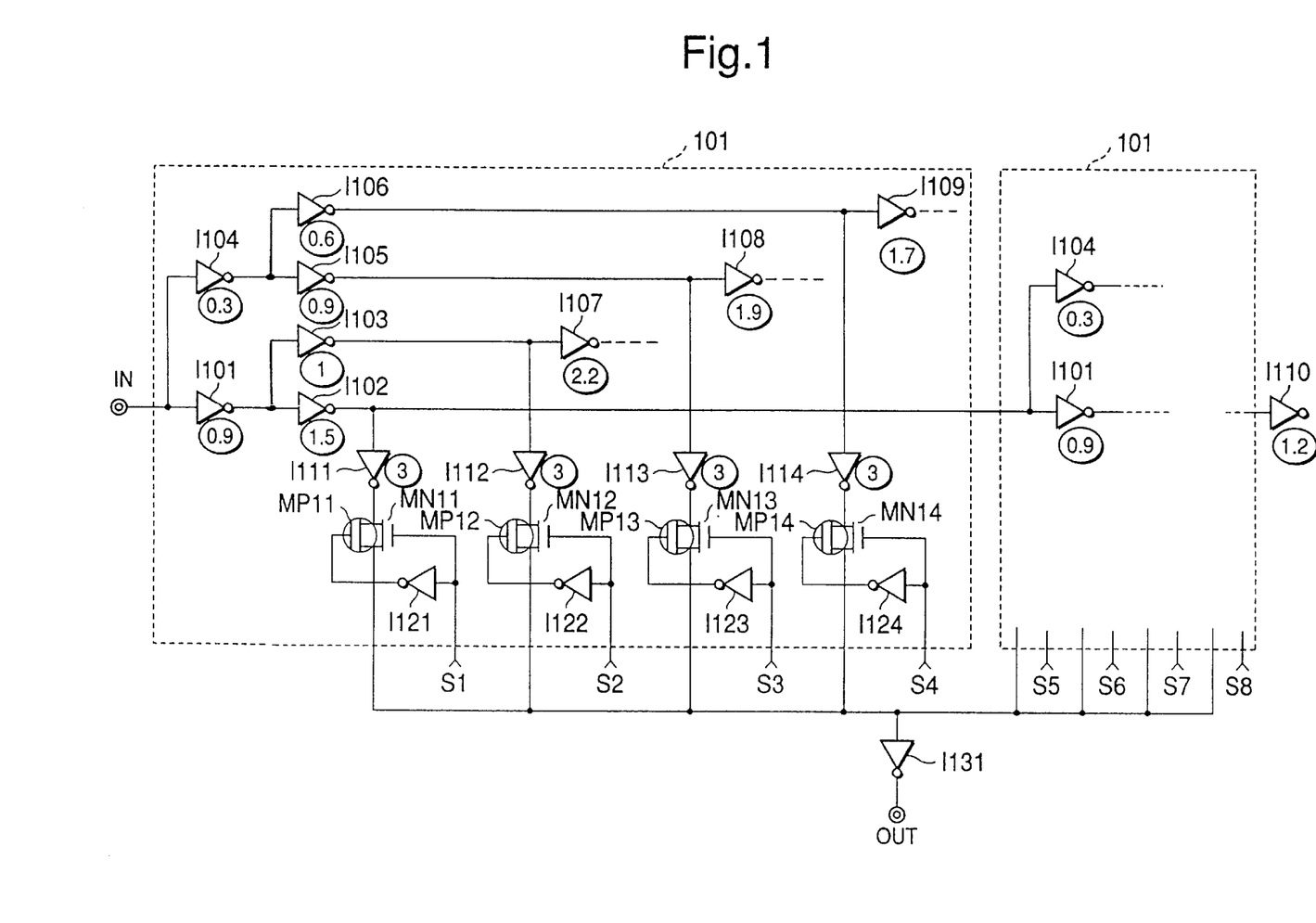
FIG. 1 is a circuit diagram showing a semiconductor delay circuit according to a first embodiment of the present invention.
Figure 2:
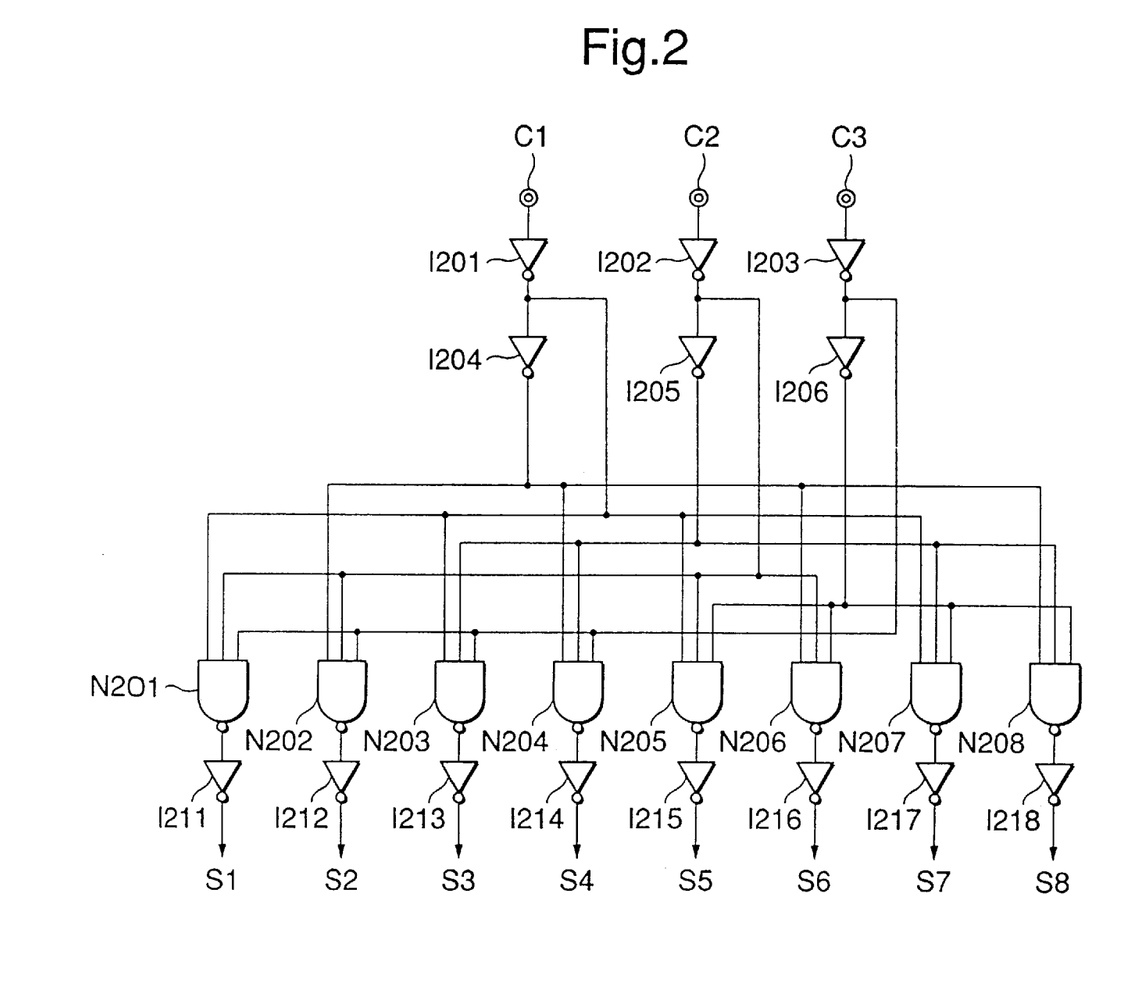
FIG. 2 is a circuit diagram showing a selection signal generator used in the semiconductor delay circuit according to the first embodiment.

FIG. 1 shows a construction of a semiconductor delay circuit according to a first embodiment of the present invention and FIG. 2 shows a circuit construction of a selection signal generator in the first embodiment of the present invention.

The selection signal generator circuit shown in FIG. 2 generates selection signals S1 to S8 in response to external control signals C1 to C3.

Figure 12:
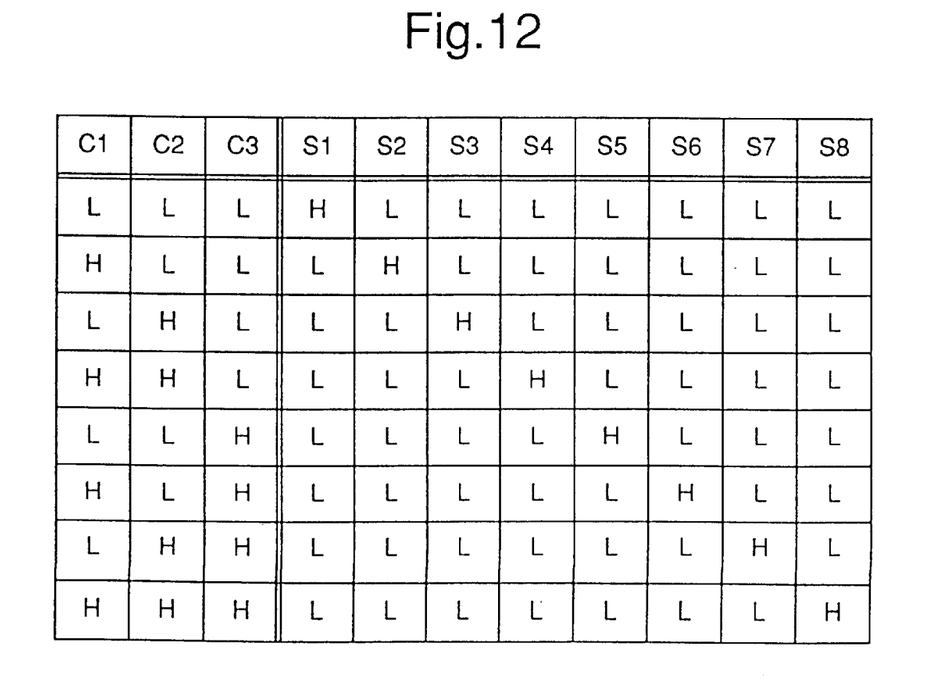
FIG. 12 is a truth table of the selection signal generator shown in FIG. 2.

FIG. 12 shows logic levels of the selection signals S1 to S8 corresponding to 8 combinations of logic levels of the external control signals C1 to C3. It is clear from FIG. 12 that, for each combination of the external control signals Cl to C3, only one of the selection signals S1 to S8 becomes "H" level.

In the delay circuit shown in FIG. 1, the propagation delay time tpd of each of inverters in an initial inverter tree circuit 101 will be described. In FIG. 1, encircled numerals attached to the respective inverters represent the relative sizes thereof as mentioned previously.

Referring to FIG. 1, an inverter I101 has a relative size of 0.9 and inverters I102 and I103 have relative sizes of 1.5 and 1, respectively. Therefore, the ratio of the relative size becomes 0.9:(1.5+1)=0.9:2.5 1:2.8. That is, m=2.8 and tpd= 240 psec results from FIG. 10.

Similarly, for the inverter I103, the ratio of relative size of the inverter to the load which is the inverters I107 and I112 becomes 1:(2.2+3)=1:5.2. Thus, m=5.2, resulting in tpd=360 psec.

By performing the same calculation for the inverters I104, I105 and I106, tpd=350 psec, 370 psec and 490 psec are obtained.

Further, for the inverter I102, its load is the inverter I111 and the inverters I101 and I104 which constitute the succeeding inverter tree circuit 101 having a similar construction as that of the preceding inverter tree circuit. Therefore, the ratio of relative size of the inverter I102 itself to the load becomes 1.5:(3+0.9+0.3)=1.5:4.2=1:2.8, resulting in tpd= 240 psec.

Similarly to the prior art, in the switch circuit controlled by the selection signal, it is assumed that transistors MP11, MP12, MP13 and MP14 have the same size, transistors MN11, MN12, MN13 and MN14 have the same size and inverters I121, I122, I123 and I124 have the same size. Therefore, propagation delay times of a path from the inverter I111 to the inverter I131, a path from the inverter I112 to the inverter I131 and a path from the inverter I114 to the inverter I131 become the same. This propagation delay time will be referred to as B(psec) for convenience.

Therefore, when the selection signal S1 is selected, that is, when the selection signal S1 is High level, the total propagation delay time from the input terminal IN to the output terminal OUT is a sum of the delay times of the inverters I101, I102, I111 to I131 and it becomes as follow.

240+240+B=480+B(psec)

Similarly, when the selection signal S2 is selected, the total propagation delay time from the input terminal IN to the output terminal OUT is a sum of delay times of the inverters I101, I103, I112 to I131, resulting in:

240+360+B=600+B(psec)

When the selection signal S3 is selected, the total propagation delay time is a sum of delay times of the inverters I104, I105, 1113 to I131, resulting in:

350+370+B=720+B(psec)

And, when the selection signal S4 is selected, the sum of delay times of the inverters I104, I106, I114 to I131 results in:

350+490+B=840+B(psec).

In a case where the selection signal S5 is selected, a signal passes from the input IN through the inverters I101 and I102 and through the inverters I101, I102, I111 to I131 of the next inverter tree circuit to the output OUT.

Therefore, the total propagation delay time becomes:

240+240+240+240+B=960+B(psec)

For the selection signals S6, S7 and S8, the similar calculations result in:

240+240+240+360+B=1080+B(psec)

240+240+350+370+B=1200+B(psec)

240+240+350+490+B=1320+B(psec)

In FIG. 1, the rightmost inverter I110 is used for regulating the load.

Figure 13:
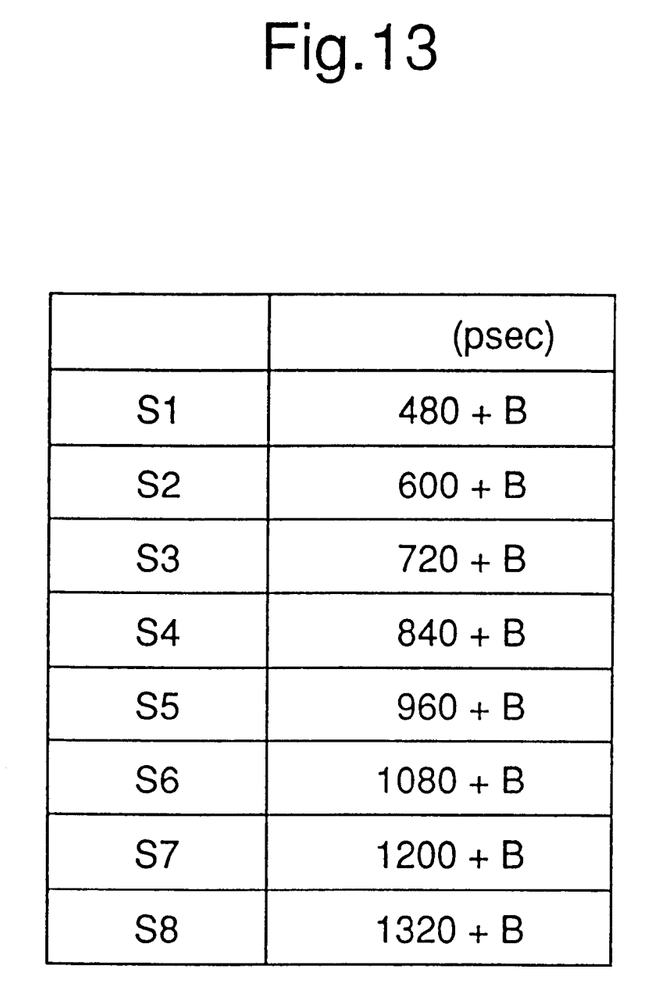
FIG. 13 is a table showing a relation between respective selection signals and amounts of delay in the semiconductor delay circuit according to the first embodiment of the present invention.

FIG. 13 is a table showing a list of calculation results.

From FIG. 13, it is clear that, when the selection signal is switched from S1 through S2 and S7 to S8, the total delay time increases by 120 (psec) successively. In other words, the delay time can be regulated with a pitch of 120 (psec). That is, comparing with the pitch of 400 (psec) of the prior art delay circuit, the regulation pitch of the delay circuit of the present invention is substantially reduced to as small as 30%.

As is clear from the above description, in the delay circuit of the present invention, the inverter tree circuit 101 having four propagation paths each composed of two inverters and the delay time can be regulated with the small pitch of 120 (psec) by regulating the relative sizes of the respective inverters. Further, by connecting two inverter tree circuits in series, the number of regulation steps is increased. Further, in order to make the regulating pitch of the delay time 120 (psec) similarly when the selection signal S4 is selected and when the selection signal S5 is selected, the relative sizes of the respective inverters are set such that the sum of the delay times of the inverters I101 and I102 becomes 480 psec which is four times 120 psec.

In general, by setting the relative size (that is, the transistor size) of an inverter such that (shortest delay time of propagation paths of an inverter tree circuit)=(delay time pitch) (number of propagation paths in the inverter tree circuit), it is possible to regulate delay times of all transmission paths with the same pitch even when a plurality of inverter tree circuits are connected in series.

When the above equation is applied to this embodiment, it is possible to confirm that the delay time is 480(psec)= 120(psec)×4.

As mentioned above, a design of the relative sizes of the respective inverters is relatively simple. Particularly, the relative sizes of the (dummy) load inverters I107, I108 and I109 can be freely set according to the relative sizes of other inverters. Therefore, the design is simple provided that the relative sizes of other inverters are suitably set.

In a practical design, effects of parasitic capacitances of metal wiring connecting between the respective inverters must be considered. Therefore, the design preciseness should be increased by using a simulator such as the circuit simulator SPICE. However, it is, of course, possible to use the above mentioned method in a basic design.

Now, a semiconductor delay circuit according to a second embodiment of the present invention will be described.

Figure 3:
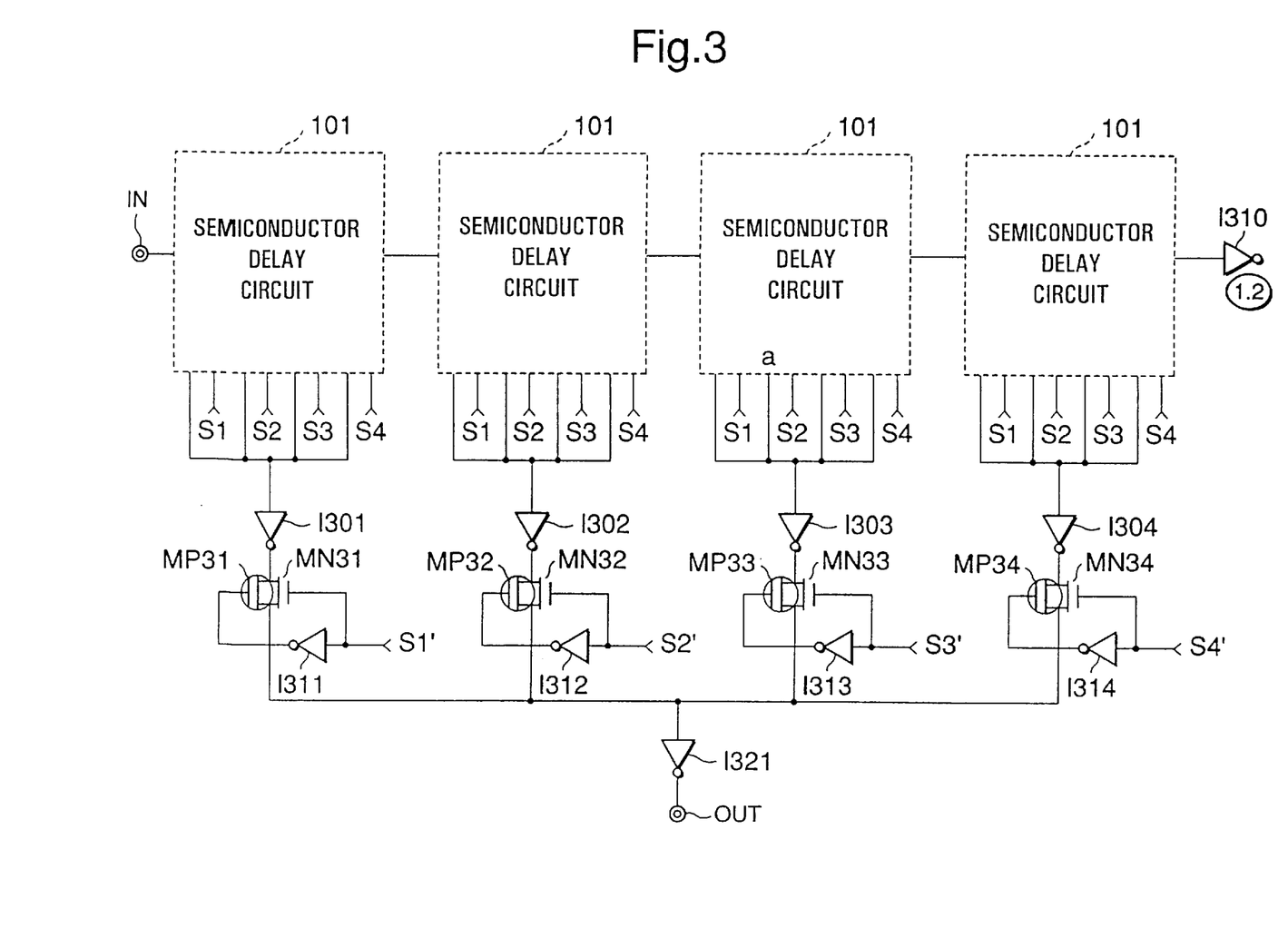
FIG. 3 is a circuit diagram of a semiconductor delay circuit according to a second embodiment of the present invention.
Figure 4:
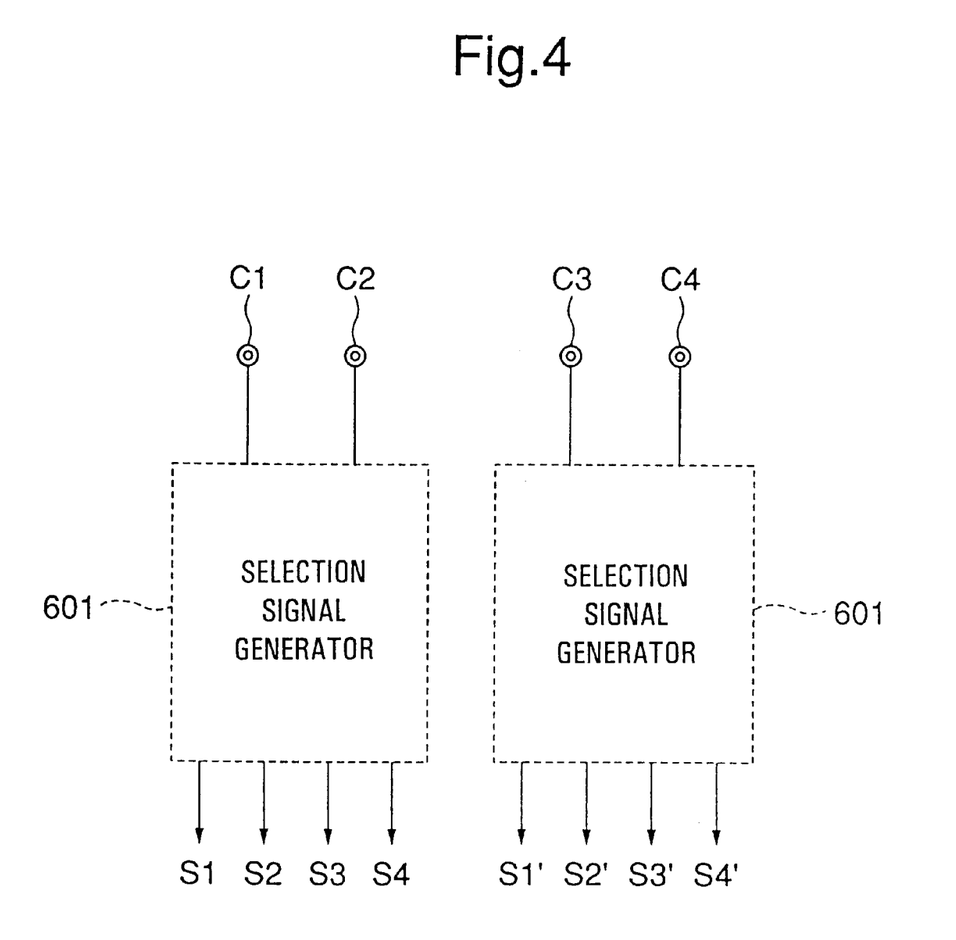
FIG. 4 is a circuit diagram showing a selection signal generator used in the semiconductor delay circuit according to the second embodiment.

FIG. 3 shows a main portion of the semiconductor delay circuit according to the second embodiment and FIG. 4 shows a circuit construction of a selection signal generator in the second embodiment.

Referring to FIG. 4, the selection signal generator is composed of two circuits 601 each generates four selection signals in response to two external control signals. In FIG. 4, a left side circuit 601 outputs selection signals S1 to S4 in response to external control signals C1 and C2 and a right side circuit 601 outputs selection signals S1' to S4' in response to external control signals C3 and C4.

Figure 5:
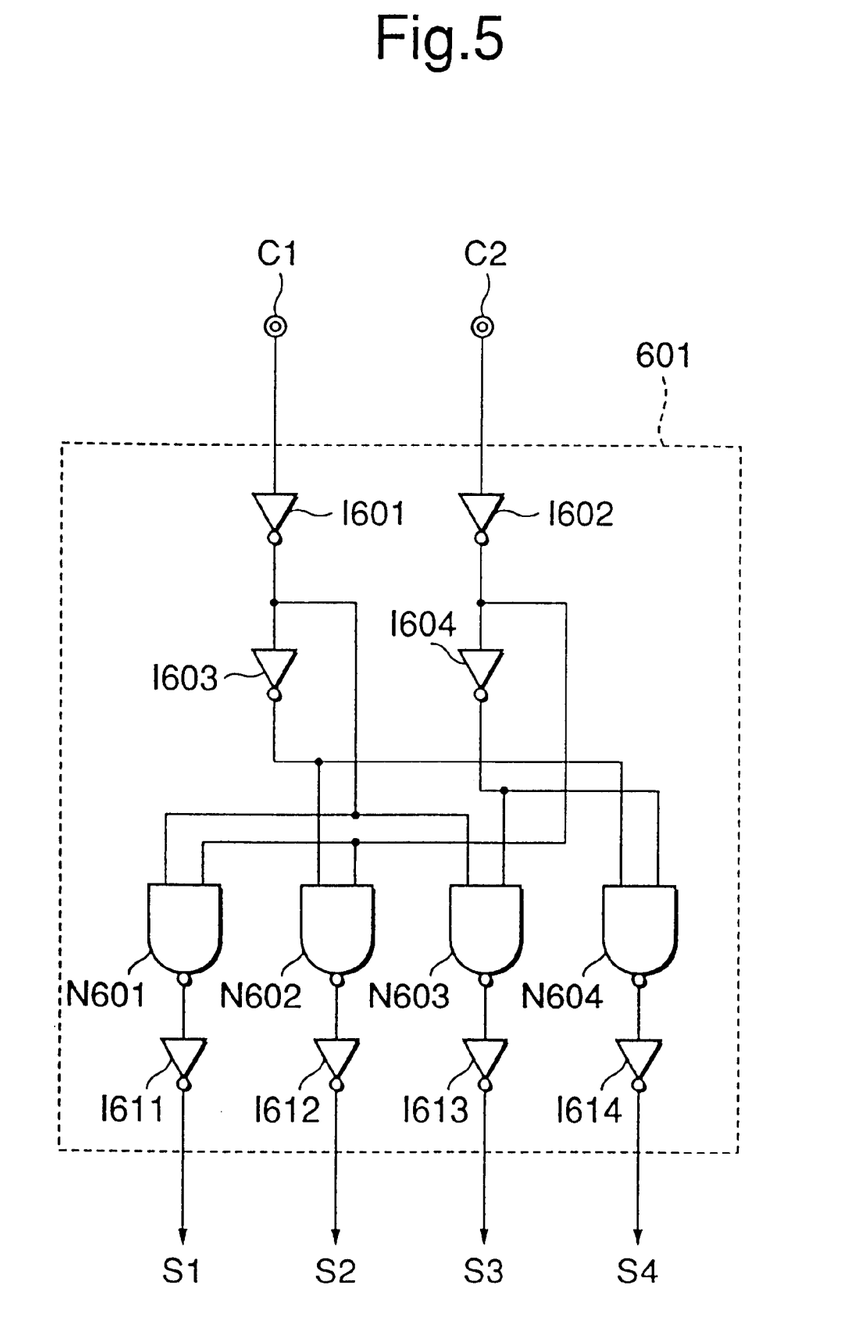
FIG. 5 is a circuit diagram of the selection signal generator 601 shown in FIG. 4.
Figure 11:
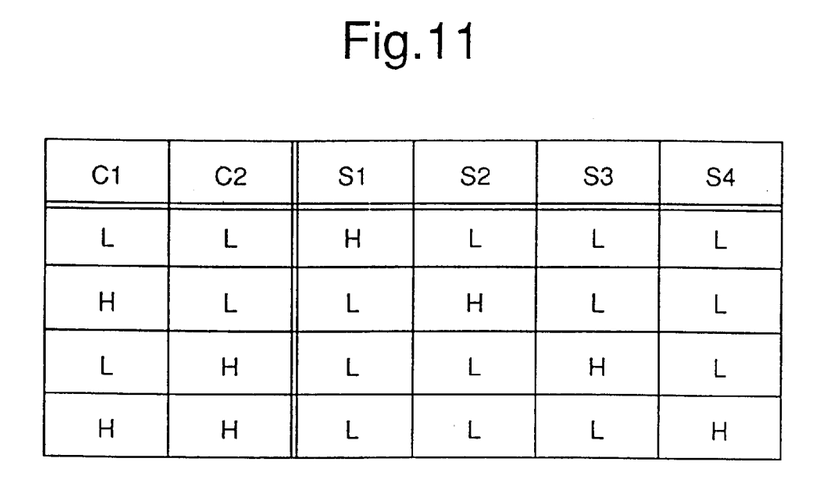
FIG. 11 is a truth table of the selection signal generator 601 shown in FIG. 5.

FIG. 5 shows a circuit construction of the selection signal generator 601 which generates the selection signals S1 to S4 or S1' to S4' shown in FIG. 4. As will be clear from FIG. 5, the selection signal generator 601 is a kind of decoder circuit and, as shown in FIG. 11, one of the selection signals S1 to S4 which becomes "H" level is determined according to combinations of logic levels ("H" or "L") of the external control signals C1 and C2. That is, a desired one of the selection signals S1 to S4. FIG. 11 is a truth table showing logic of the decoder circuit shown in FIG. 5. For example, when the external control signal C1="H" and the external control signal C2="L", it becomes that the selection signal S2="H", the selection signal S1=the selection signal S3=the selection signal S4="L" and thus the selection signal S2 is selected. This is the same for the relation between the external control signals C1' and C2' and the selection signals S1' to S4'.

Therefore, only one of the selection signals S1 to S4 becomes "H" level and only one of the selection signals S1' to S4' becomes "H" level according to combinations of the logic levels of the external control signals C1, C2, C3 and C4.

The semiconductor delay circuit according to the second embodiment of the present invention will be described with reference to FIG. 3. In the second embodiment, four inverter tree circuits 101 each shown in FIG. 1 are connected in series. Further, in FIG. 3, a load regulating inverter I310 is connected to a right side end of the series connection of these inverter tree circuits.

The selection signals S1 to S4 are input to the four inverter tree circuits 101 commonly. Four outputs of each of the inverter tree circuits 101 are joined and connected to an input of an inverter I301 (or I302 or I303 or I304).

An output of the inverter I301 is connected to a switch circuit which receives the selection signal S1' and is composed of a P channel transistor MP31, an N channel transistor MN31 and an inverter I311. Outputs of the inverters I302 to I304 are connected to switch circuits controlled by the selection signal S2', etc., respectively.

Finally, outputs of the switch circuits are jointed and output to the output terminal OUT through an inverter I321.

Since, as mentioned previously, one of the selection signals S1 to S4 is selected and one of the selection signals S1' to S4' is selected, only one of 16 (4×4) propagation paths is connected to the output terminal OUT. For example, when the selection signals S2 and S2' are selected, the transmission path passing through a second output (passing through a location a shown in FIG. 3) of a third inverter tree circuit 101 from a left end in FIG. 3 arrives at the output terminal OUT.

In the latter case, the total delay time from the input terminal IN to the output terminal OUT becomes $$240+240+240+240+350+370+C=1680+C(\text{psec})$$

by a calculation similar to the first embodiment, where C is a sum of a propagation delay time from the inverter I111 (or I112, etc.) in the inverter tree circuit 101 through the MOS transistor MP11 (or MP12, etc.) and the MOS transistor MN11 (or MP12, etc.) to the inverter I321 and a propagation delay time from the inverter I301 (or I302, etc.) through the MOS transistor MP31 (or MP32, etc.) and the MOS transistor MN31 (or MN32, etc.) to the inverter I321.

As mentioned previously, the delay times of the propagation paths after the inverter I111 (or I112, etc.) are the same. Further, the sizes of the inverters I301, I302, I303 and I304 are the same, the sizes of the transistors MP31, M32, MP33 and MP34 are the same, the sizes of the transistors MN31, MN32, MN33 and MN34 are the same and the sizes of the inverters I311, I312, I313 and I314 are the same as in the first embodiment.

Therefore, the propagation delay times of the propagation paths from the inverter I301 to the inverter I321, from the inverter I302 to the inverter I321, from the inverter I303 to the inverter I321 and from the inverter I304 to the inverter I321 are the same. Thus, C can be commonly used in all of the 16 propagation paths.

Figure 14:
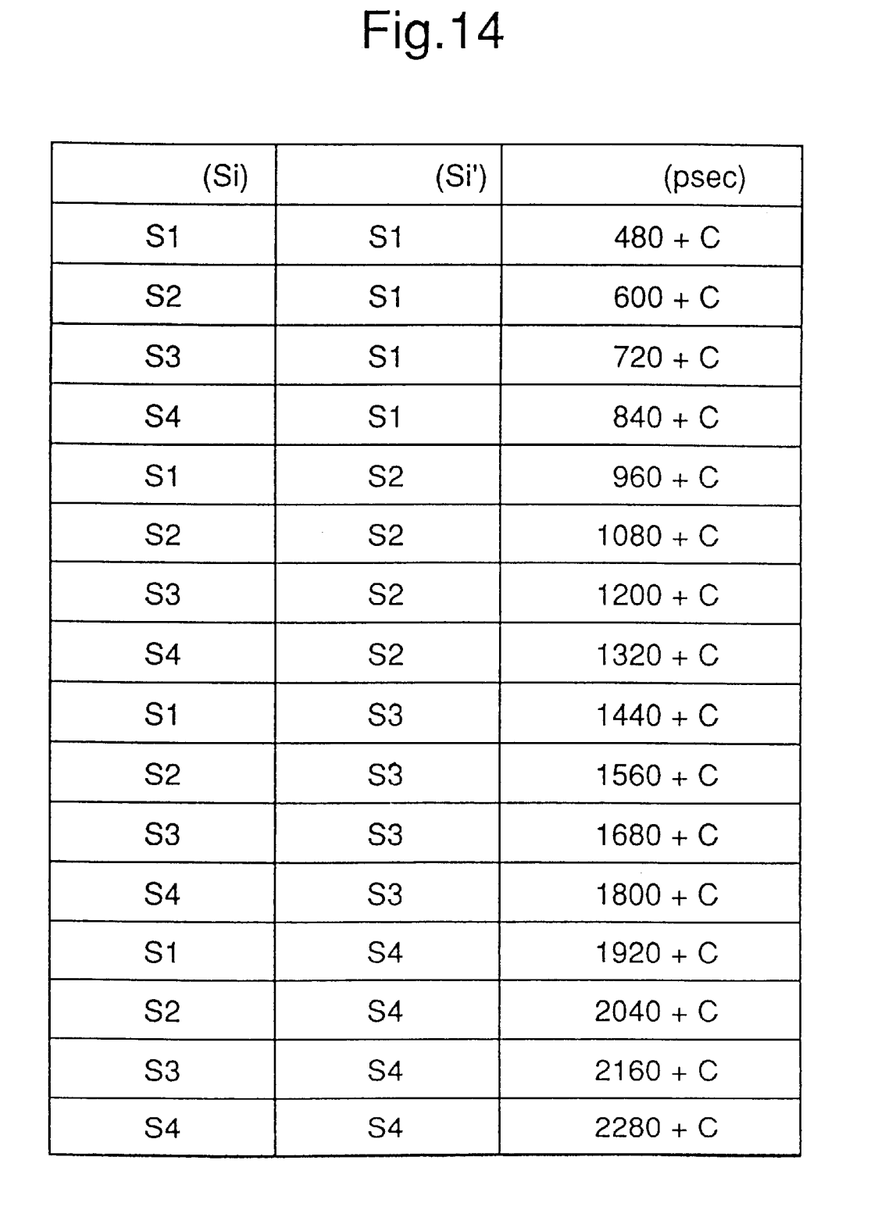
FIG. 14 is a table showing a relation between respective selection signals and amounts of delay in the semiconductor delay circuit according to the second embodiment of the present invention.

FIG. 14 shows a relation between the selection signals and the delay time of the semiconductor delay circuit according to the second embodiment.

Therefore, according to this embodiment, a semiconductor delay circuit having 16 regulation step with a pitch of 120 psec.

A semiconductor delay circuit according to a third embodiment of the present invention will be described.

Figure 6:
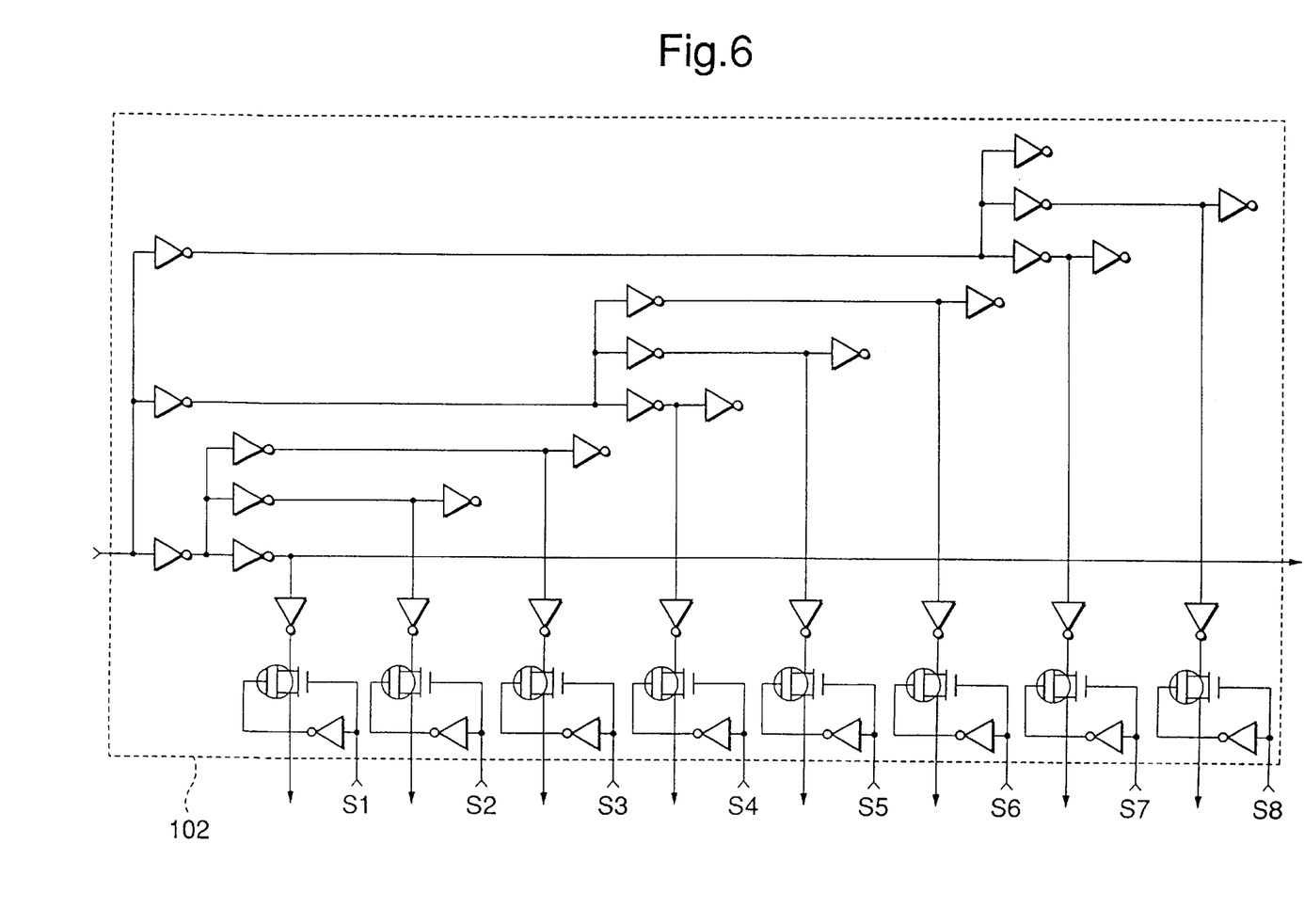
FIG. 6 is a circuit diagram of a semiconductor delay circuit according to a third embodiment of the present invention.

FIG. 6 shows a main portion (inverter tree circuit) of the third embodiment of the present invention. Although, in FIG. 16, only one inverter tree circuit 102 is shown, 16 (or 32) propagation paths can be obtained by connecting two (or four) inverter tree circuits 102 in series. Other circuit construction than the inverter tree circuit 102 are the same as those of the first or second embodiment.

As shown in FIG. 6, each branching point of the inverter tree circuit 102 is branched to 3 so that 9 (3×3) propagation paths are provided. In this embodiment, however, in order to make the construction of the selection circuit system simple, 8 of the 9 propagation paths are used. By increasing the number of propagation paths in the inverter tree circuit in this manner, it is possible to make the pitch of delay time regulation smaller than that in the first or second embodiment. For example, the delay time regulation pitch obtainable in the third embodiment can be about 70 psec which is considerably smaller than 120 psec in the first or second embodiment.

Although, in the described embodiments, the control signal C1, etc., are supplied from the external terminal, such signal is not limited to such external signal and may be a signal produced internally of the LSI such as DRAM. Similarly, the input terminal In and the output terminal OUT may be internal nodes. The present invention is not limited to the described embodiments and it should be noted that various modifications thereof fall within the present invention.

As described hereinbefore, according to the present invention provides the following effects:

A first effect of the present invention is that it is possible to substantially reduce the delay time regulation pitch.

This is because a plurality of propagation paths having delay time different with an equal pitch are formed by constructing an inverter tree circuit and changing the relative sizes (transistor sizes) of respective inverters of the inverter tree circuit.

A second effect of the present invention is that it is possible to increase the number of delay time regulation steps.

This is because there is no increase of the delay time even when the number of delay time regulation steps is increased since the number of propagation paths can be increased by connecting a plurality of inverter tree circuits in series and the delay time regulation pitch is small.

A third effect of the present invention is that it is possible to provide delay times different with an equal pitch to all of the propagation paths when a plurality of inverter tree circuits are connected in series.

This is because the relative sizes (transistor sizes) of the respective inverters are set such that the shortest delay time of the propagation paths in the inverter tree circuit becomes (delay time regulation pitch)=(number of propagation paths in the inverter tree circuit).

What is claimed is:

1. A semiconductor delay circuit comprising:

a first invertor circuit having an input node coupled to an input terminal and an output node;

a second inverter circuit having an input node coupled to said output node of said first inverter circuit and an output node coupled to an output terminal via a first transfer gate, said second inverter circuit having a first current drive ability;

a third inverter circuit having an input node coupled to said output node of said first inverter circuit and an output node coupled to said output terminal via a second transfer gate, said third inverter circuit having a second current drive ability different from that of said first current drive ability;

a fourth inverter circuit interposed between said second inverter circuit and said first transfer gate;

a fifth inverter circuit interposed between said third inverter circuit and said second transfer gate, each of said fourth and fifth inverter circuits having the same current drive ability;

a sixth inverter circuit having an input node coupled to said input terminal and an output node;

a seventh inverter circuit having an input node coupled to said output node of said sixth inverter circuit and an output node coupled to said output terminal via a third transfer gate, said seventh inverter circuit having a third current drive ability;

an eighth inverter circuit having an input node coupled to said output node of said sixth inverter circuit and an output node coupled to said output terminal via a fourth transfer gate, said eighth inverter circuit having a fourth current drive ability different from that of said third current drive ability; and a ninth inverter circuit having an input node coupled to said output node of said third inverter circuit and an output node, said output node of said ninth inverter circuit floating.

2. A semiconductor delay circuit, comprising:

a first inverter circuit having an input node and an output node, said input node being coupled to an input terminal;

a second and a third inverter circuit each having an input and an output node, said input nodes of said second and third inverter circuits being commonly connected to said output node of said first inverter circuit;

a fourth and a fifth inverter circuit each having an input and an output node, said input nodes of said fourth and fifth inverter circuits being commonly connected to said output node of said second inverter circuit;

a sixth and a seventh inverter circuit each having an input and an output node, said input nodes of said sixth and seventh inverter circuits being commonly connected to said output node of said third inverter circuit;

a first transfer gate interposed between said output node of said fourth inverter circuit and an output terminal; and a second transfer gate interposed between said output node of said sixth inverter circuit and said output terminal, wherein said fifth inverter circuit is a dummy circuit that provides a load to said output node of said second inverter circuit, and said seventh inverter circuit is a dummy circuit that provides a load to said output node of said third inverter circuit.

3. The semiconductor delay circuit as claimed in claim 2, wherein said first through third inverter circuits have first through third driving abilities, respectively, a ratio of said first driving ability to said second driving ability being different from a ratio of said first driving ability to said third driving ability.

4. The semiconductor delay circuit as claimed in claim 3, wherein said fourth through seventh inverter circuits have fourth through seventh driving abilities, respectively, a ratio of said second driving ability to a first value corresponding to an added ability of said fourth and fifth driving abilities being different from a ratio of said third driving ability to a second value corresponding to an added ability of said sixth and seventh driving abilities.

5. A semiconductor delay circuit, comprising:

input and output terminals;

a first group of inverters including first and second inverter circuits, each of said first and second inverter circuits having input and output nodes, said input nodes of said first and second inverter circuits being commonly connected to said input terminal;

a second group of inverters including third through sixth inverter circuits, each of said third through sixth inverter circuits having input and output nodes, said input nodes of said third and fourth inverter circuits being commonly connected to said output node of said first inverter circuit, said input nodes of said fifth and sixth inverter circuits being commonly connected to said output node of said second inverter circuit; and a selection circuit electrically coupling one of said output nodes of said third through sixth inverter circuits to said output terminal in response to a selection signal.

* * * * *